United States Patent
Bradford

(10) Patent No.: US 10,627,445 B2
(45) Date of Patent: Apr. 21, 2020

(54) METHOD FOR TESTING AN ELECTRONIC DEVICE AND AN INTERFACE CIRCUIT THEREFORE

(71) Applicant: TDK-Micronas GmbH, Freiburg (DE)

(72) Inventor: Jonathan Bradford, Freiburg (DE)

(73) Assignee: TDK—Micronas GmbH, Freiburg (DE)

(*) Notice: Subject to any disclaimer, the term of this patent is extended or adjusted under 35 U.S.C. 154(b) by 0 days.

(21) Appl. No.: 16/043,196

(22) Filed: Jul. 24, 2018

(65) Prior Publication Data

US 2019/0025373 A1 Jan. 24, 2019

(30) Foreign Application Priority Data

Jul. 24, 2017 (EP) ..................... 17182822

(51) Int. Cl.
*G01R 31/317* (2006.01)
*H04L 25/49* (2006.01)
*G01R 31/3177* (2006.01)
*G01R 31/3185* (2006.01)

(52) U.S. Cl.
CPC ... *G01R 31/31712* (2013.01); *G01R 31/3177* (2013.01); *G01R 31/31713* (2013.01); *G01R 31/318533* (2013.01); *H04L 25/4923* (2013.01)

(58) Field of Classification Search
CPC ........ G01R 31/31712; G01R 31/31713; H04L 25/4923
See application file for complete search history.

(56) References Cited

U.S. PATENT DOCUMENTS

| | | | |
|---|---|---|---|
| 7,770,812 B2 | 8/2010 | Sebastian | |
| 8,443,125 B2* | 5/2013 | Beccue | G06F 1/06 341/50 |
| 2005/0216803 A1* | 9/2005 | Ozaki | G01R 31/318572 714/724 |
| 2006/0087303 A1 | 4/2006 | De Winter | |
| 2008/0031167 A1 | 2/2008 | Chen | |
| 2008/0091992 A1* | 4/2008 | Juhn | G01R 31/31701 714/724 |
| 2014/0281076 A1 | 9/2014 | Breece, III | |
| 2016/0087822 A1 | 3/2016 | Kossel | |

* cited by examiner

*Primary Examiner* — Joseph D Torres
(74) *Attorney, Agent, or Firm* — 24IP Law Group USA, PLLC; Timothy Dewitt

(57) ABSTRACT

A method and interface circuit for testing an electronic device with a single logic pin is disclosed. The comprises forming a data stream having three level bands; inputting the data stream through a single logic pin; and decoding the data stream to identify a scan_in signal, a scan_shift_enable signal and a scan_out signal and returning contemporaneously a scan_out signal as an output through the same logic pin. The interface circuit includes a decoder connected to the single logic pin.

12 Claims, 5 Drawing Sheets

METHOD FOR TESTING AN ELECTRONIC DEVICE AND AN INTERFACE CIRCUIT THEREFORE

CROSS-REFERENCE TO RELATED APPLICATION

This application claims benefit of and priority to European Patent Application No. EP17182822.1, filed on 24 Jul. 2017. The entire disclosure of European Patent Application No. EP17182822.1 is hereby incorporated by reference.

FIELD OF THE INVENTION

The invention relates to a method of testing an electronic device using a data stream with three level bands and an interface circuit for the electronic device.

BACKGROUND OF THE INVENTION

A known method for testing of electronic devices with digital circuits involves the use of scan path testing methods. Such scan path testing methods involve configuring the internal storage elements of the electronic device such that the internal storage elements can operate in two or more modes. In a first mode, the internal storage elements perform the designed task for the normal operation of the electronic device. In a second mode, the internal storage elements can be connected in a chain to produce long chains of internal storage elements in the form of a scan shift register. The first storage element in the scan shift register has its serial input connected to an input pin of the integrated circuit and the last element of the scan shift register has its serial output connected to an output pin.

The clocking signal of the internal storage elements is also arranged to be connected to a common clock line for each of the internal storage elements. The common clock line is also connected to the input pin. In the test mode, the internal storage elements can be set to any combination of logic states by scanning in a test pattern along the scan shift register from the input pin. The testing of the digital circuit is carried out in normal mode and, after performing the test, the resulting output is scanned out of the internal storage registers through an output pin for evaluation by a tester.

Many electronic devices are limited in the number of output pins and input pins. This is particularly true for the electronic devices used in automotive and sensor applications where the amount of real estate available on the chip for the inputs and outputs is substantially limited.

Typically, a scan shift interface for test purposes would require four pins: scan clock, scan in, scan shift enable and scan out. These four pins are used to control and observe the scan register chains when testing, configuring and debugging the electronic device. In a pin-limited electronic device, it is not possible to provide the four pins and there is thus a need to develop a method for communicating with the electronic device and an interface circuit to the electronic device to enable testing to take place.

The communication between the internal storage elements forming the chains of the scan shift registers needs to be synchronous and thus the data stream in the form of test patterns needs to be applied coherently to the electronic device.

It is known that the length of the chain of the shift scan register is arbitrary and will depend on the number of internal storage registers available. It is therefore, in many cases, not possible to apply a test pattern of standard length to the electronic device and means have to be provided to cater for such irregular lengths of test patterns. There is therefore also a need for a scan_shift_enable signal to be encoded at the start of a data stream in which the test patterns are shifted into the scan shift register. The use of the scan_shift_enable signal enables the serial application of the scanned input data for the test patters as well as capture of the responses of the electronic device and scanning out of the responses.

As mentioned above, the current art for scanning in test patterns requires four pins. Current known serial interface circuits for the electronic devices with a low number of pins, i.e. fewer than four pins, require fixed baud rates or RF encoding with framing conventions used for fixed length data sequences. Such serial interface circuits are complex and carry a large implementation overhead on the chip, as well as being unsuitable for use with scan shift data, such as that used for the testing.

U.S. Pat. No. 8,443,125 (Beccue, assigned to Analog Devices), teaches a method for communication between two devices using a single pin. The method includes combining a data stream and a clock signal to form a three-voltage level data stream. The third voltage level records the transitions of the clock while the serial data is either high or low. This is achieved by using the first voltage level and the second voltage level when the serial clock is low and the serial data is respectively high or low and the third voltage level when the serial clock is high, so that transitions of the serial clock are present in the combined data stream. The protocol described in this patent provides a simple way for transmitting data and a clock signal between two devices over a single wire. It fails to teach, however, how this system could be applied to scanning test patterns into an electronic device to be tested.

U.S. Pat. No. 7,770,812 (Merk, assigned to Texas Instruments) describes an interface system for a single logic input pin of an electronic system. The interface system includes a decoder for converting a pulse coded signal applied to the logic input pin to a sequence of logic low and logic high values, as well as a state machine which is responsive to the sequence of logic values to switch the electronic system between different modes of operation. The interface can be used to scan programming data into the electronic system.

Another interface circuit for a single pin is known from U.S. Patent Application Publication No. 2006/0087307 (De Winter).

SUMMARY OF THE INVENTION

A method for testing an electronic device is disclosed in this description. The method comprises forming an input data stream having three level bands, inputting the input data stream through a single logic pin, and decoding the data stream to identify a scan_in signal, a scan_shift_enable signal and a scan_clock signal whilst returning contemporaneously a scan_out signal over the same logic pin. The use of the three levels bands enables the signals to be appropriately encoded and transmitted over a single wire to the single logic pin.

The three level bands could be one of three voltage bands or three current bands. One of the three level bands is weakly driven and the other two of the three level bands are strongly driven.

A transition between one of the three level bands to another one of the three level bands defines a clock cycle edge and thus a clock signal can also be derived from the data stream. It will be appreciated further that the data stream further comprises a plurality of test values.

The test values are shifted into a scan shift register after detection of a scan_shift_enable signal and can be shifted out of the scan shift register at the completion of the test procedure.

A duplex interface circuit for applying an input data stream and reading an output data stream for testing an electronic device through a single logic input pin connected to the electronic device is also disclosed. The interface circuit comprises a level detection circuit connected to the single logic input pin and configured to detect one of three level bands in the input data stream, and band thresholds modulated by returned binary values in the output data stream. The interface circuit further comprises a decoder connected to the level detection circuit for generating one of a group of signals comprising a scan_in signal, a scan_shift_enable signal or a scan_out signal and applying the generated one of the group of signals to a shift scan register.

The interface circuit can also generate a clock signal from the input data stream.

BRIEF DESCRIPTION OF THE DRAWINGS

Further properties and advantages of the invention result from the following, purely illustrative and in no way limiting description of preferred embodiments of the invention with reference to the attached drawings, which are described as follows.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
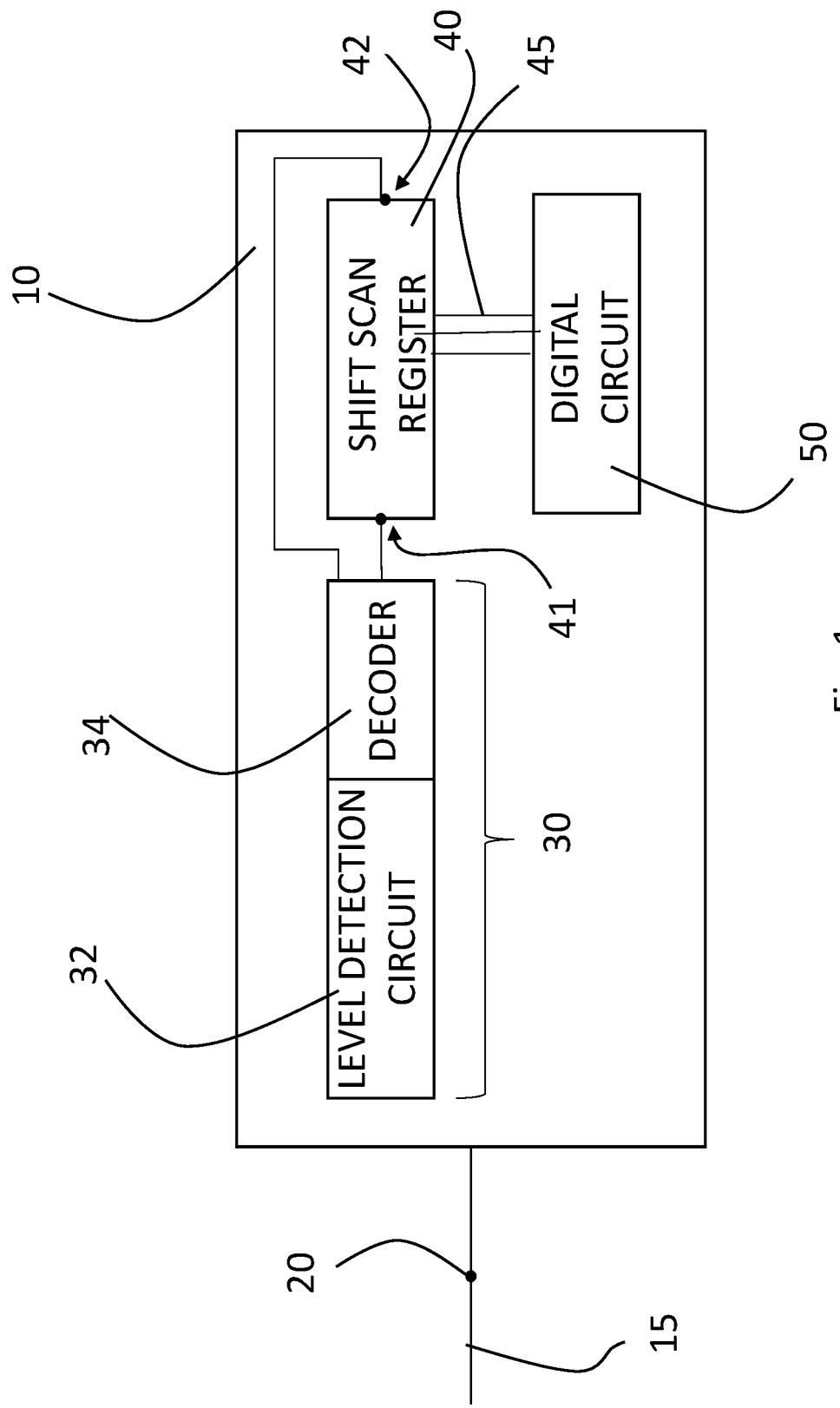
FIG. 1 shows an overview of an electronic device with a single logic pin.

FIG. 1 shows an overview of an electronic device 10 with a single logic pin 20 connected to the electronic device 10. The digital circuit 50 to be tested is connected to a shift scan register 40 through a plurality of connections 45. The shift scan register 40 has a plurality of internal registers connected in a serial manner to each other through which values may be shifted. An interface circuit 30 is connected to the input 41 of the shift scan register 40, the output 42 of the shift scan register 40 and the logic pin 20. The interface circuit 30 comprises a level detection circuit 32 and a decoder 34. The interface circuit 30 receives an input data stream from the logic pin 20 and passes the input data stream to the shift scan register 40. The interface circuit 30 is a duplex circuit and receives an output data stream of returned output shift values from the output 42 of the shift scan register, as shown in FIG. 1, and explained below.

The interface circuit 30 can establish the levels on the incoming input data stream from the logic pin 20 in the level detection circuit 32. It will be appreciated that these levels on the logic pin 20 will be offset by the values of the returned output shift values in an output stream from the output 42 of the register 40 that are superimposed on the values in the incoming data stream on the logic pin 20. The interface circuit 30 compensates for the superimposed values on the output data stream and decodes the signals in the input data stream in the decoder 34 and can establish a clock signal from the transitions in the input data stream, as will be outlined below.

The logic pin 20 is connected to a wire 15. The wire 15 carries the input data stream for the interface circuit 30 from a data stream generator (shown as element 300 in FIG. 3). The input data stream on the wire 50 is encoded as three voltage bands or three current bands having different levels. Two of the three levels are strongly driven. The third level is weakly driven. The physical value of the three levels is arbitrary, as long as the levels are defined in discrete, non-overlapping bands with known comparator thresholds, which can be identified in the level detection circuit 32. The choice of which of the two levels are strongly driven is also arbitrary and depends on the physical limitation of the logic of the electronic device 10. In this description for convenience, the two strongly-driven levels are defined as being a high level and a low level. The more weakly driven level is defined as being the mid level in this description, but this is not limiting of the invention.

It will be appreciated that, when the weakly driven mid level is applied to the logic pin 20 of the electronic device 10, there is a risk that the mid level could be pulled up or down by the current and/or voltage in the electronic device 10. So long as this pull-up or pull-down of the mid-level is constrained to remain within a mid band set by the comparator threshold levels, no high level or low level will be mistakenly interpreted by the electronic device 10. As noted above, the knowledge of the returned output values from the output 42 can be used to offset the comparator thresholds of the band levels, thus allowing the original input data stream to be extracted.

In order to shift a test pattern into the shift scan register 40 through the input 41 and to scan out the results from the output 42 of the shift scan register 40 it is necessary to establish a protocol to transport the following four signals over the single wire 15 to the input pin 20:

Scan_in to indicate that a test pattern is to be inputted
Scan_clock to indicate a clock signal
Scan_shift_enable to enable the shifting of test pattern into the shift scan register 40
Scan_out to shift out the results of the test from the electronic device 10.

The polarity of these four signals is arbitrary. For example, the scan_shift_enable signal function to scan the test pattern through the internal registers in the shift scan register 40 or to update configuration registers and to capture device data to be shifted out from the shift scan register 40 may be defined as either being active high or low. The decoder 34 is able to decode these signals from the incoming data stream In this description, a clock cycle edge is propagated within the device 10 on every transition between ones of the three levels, i.e. low level, mid level and high level. Thus, any combination of two transitions between any of the three levels will generate a complete clock cycle. It will be appreciated that the transitions between the levels need to be suitably deglitched to avoid recording any spurious transitions. It will also be appreciated that a sampling delay is required to avoid a transition from a low level to a high level or from a high level to a low level triggering a spurious mid level transition. The input will now be described. Let us suppose that the initial state of the input pin 20 is mid level (M). The following four sequences are possible and are shown in Table 1.

TABLE 1

| Cycle No | Pin | Scan_Clock | Scan_in | Scan_Shift_Enable |
|---|---|---|---|---|
| 1) | M | 0 | ? | ! |
|  | H | p | 1 | ! |
|  | M | n | 1 | 1 |
| 2) | M | 0 | ? | ! |
|  | L | p | 0 | ! |
|  | M | N | 0 | 1 |
| 3) | M | 0 | ? | ! |
|  | H | p | 1 | ! |
|  | L | n | 1 | 0 |
| 4) | M | 0 | ? | ! |
|  | L | p | 0 | ! |
|  | H | n | 0 | 0 |

H = drive high level
M = drive mid level
L = drive low level
1 = Resulting 1 signal
0 = resulting 0 signal
p = resulting positive edge after resulting 1/0 signal
n = resulting negative edge after resulting 1/0 signal
? = previous resulting signal, do not care
! = previous resulting signal, do not care (assume 1)
@ = previously resulting signal, do not care (assume 1)

Let us now make the assumption that the scan_shift_enable signal detected in the detector 34 is active high to enable a scan of values into the internal registers of the scan shift register 40. Only one cycle is required to generate a value of zero for the scan_shift_enable signal and this cycle will be asserted at the end of the scan sequence, i.e. when all of the values have been scanned into the internal registers or all of the values have been scanned out of the internal registers. So, for the majority of the cycles, the sequences used are cycles 1) and 2) shown in Table 1.

When the cycles 3) and 4) from table 1 are applied, the scan_shift_enable signal is low (and thus no values are shifted into the internal registers of the scan shift register 40). The resulting condition on the logic pin 20 at the end of the cycle is no longer a mid level at start of the following cycle sequence, as can be seen from Table 1. For example, cycle 3) leads at the end of a sequence to a low level on the logic pin 20 and cycle 4) leads to a high level on logic in 20). In this case, however, the internal registers will have already been configured, as the zero on the scan_shift_enable signal has just been asserted. The observed results from the testing of the electronic circuit 10 are captured in the internal registers and need to be scanned out of the internal registers.

Thus, depending on the previous states, the following cycle signals are applicable to ensure that the following sequences start from initial mid level again.

TABLE 2

| Cycle No | Pin | Scan_Clock | Scan_In | Scan_Shift_Enable |
|---|---|---|---|---|
| 5) | M | 0 | ? | @ |
|  | H | p | 0 | @ |
|  | M | n | 0 | 1 |

TABLE 2-continued

| Cycle No | Pin | Scan_Clock | Scan_In | Scan_Shift_Enable |
|---|---|---|---|---|
| 6) | H | 0 | ? | @ |
|  | L | p | 1 | @ |
|  | M | N | 1 | 1 |

The cycles 5) and 6) are considered to be stuffing cycles and will occur as the first register shift after the scan register configuration or capture cycle. No relevant data will be shifted in or captured into the shift scan register 40 or will be observed from the shift scan register 40 during this cycle. The previous result cycle will be shifted out.

Figure 4:
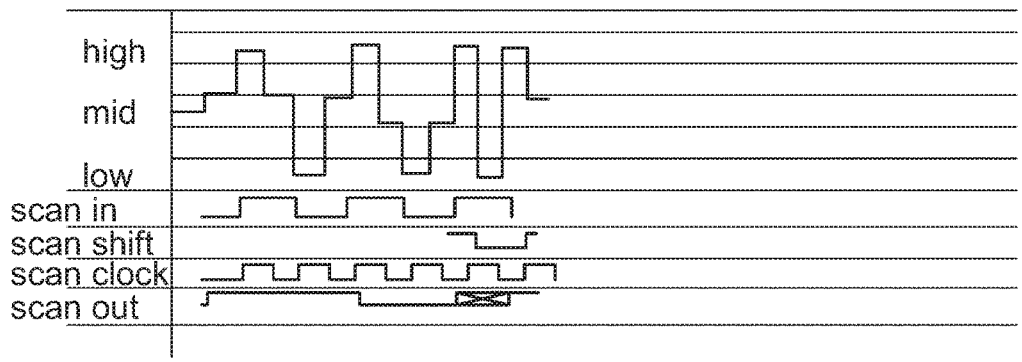
FIG. 4 shows typical transitions of the interface circuit.

As mentioned earlier, when a mid level is applied to the logic pin 20, the current value of the scan_out signal can be overlaid and observed on the logic pin 20. This is because the mid level is weakly driven into the logic pin 20. The scan_out signal value can therefore either pull up or pull down the midlevel value so long as the mid level value remains in the mid level band and cannot be falsely interpreted as a high level or a low level. Furthermore, the comparator thresholds of the mid level boundaries can be offset by the current value of the scan out signal, as can be seen in FIG. 4.

However, in the cycle sequences 3) and 4) of table 1, when the scan_shift_enable signal is not active, there is no mid level applied to the logic pin 20 and so no scan_out signal can be observed in the two cycle sequences 3) and 4). It will be appreciated that this lack of observability will only affect the result in the last internal register in the scan chain of the scan shift register 40, so if an additional scan register is added to the end of the scan shift register no captured data will be lost.

Figure 2:
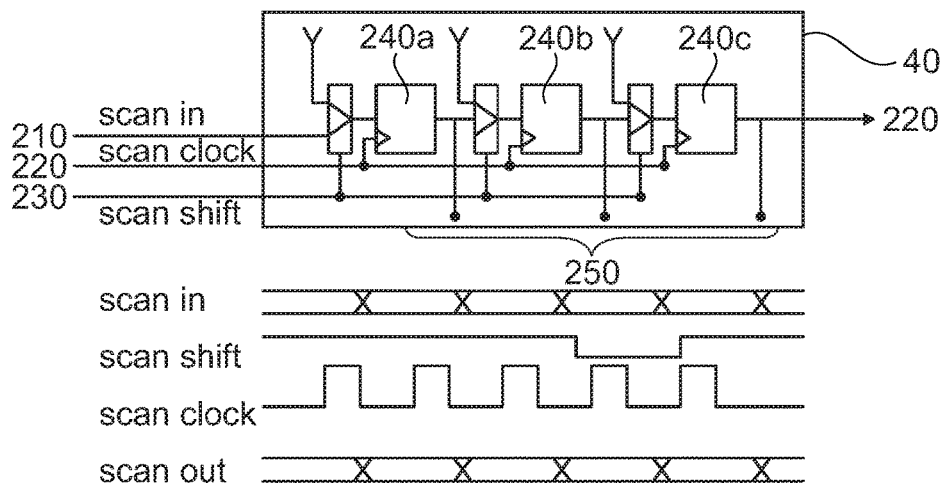
FIG. 2 shows an implementation of the scan shift register.

FIG. 2 shows an exemplary implementation of the scan shift register 40 which has a scan_in line 210, a scan_clock line 220 and a scan_shift line 230 connected to a plurality of internal registers 240*a-c*, as is known in the art. The scan shift register 40 has a scan_in line 210 for inputting or scanning into the scan shift register 40 the test pattern and thus configuring the internal registers 240*a-c* before a test is carried out. The scan shift register 40 has a scan_out line 220 for scanning out the captured results from the plurality of internal registers 240*a-c* after the test has been carried out. The internal registers 240*a-c* are connected to configure lines 250 to pass the test pattern from the configure internal registers 240*a-c* to the digital circuits under test and receive outputs from the digital circuit under test. In this example only three internal registers 240*a-c* are shown for simplicity, but it will be appreciated that there will be many more internal registers 240*a-c* in practice.

The timing diagram shown in FIG. 2 is a typical timing diagram found in the scan shift register 40.

Figure 3:
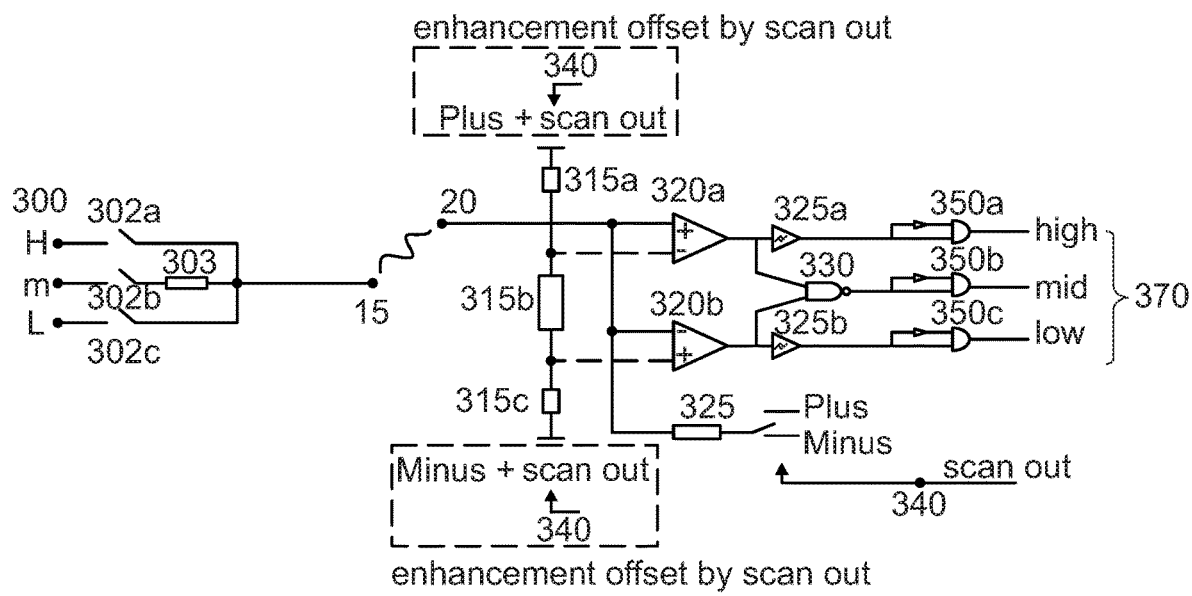
FIG. 3 shows an implementation of the level detection circuit.

FIG. 3 shows how the level detection circuit 32 with an output 370 can be implemented to receive a data stream along the wire 15 from a data stream generator 300 and used to determine the levels. It will be seen that the data stream generator 300 comprises a plurality of switches 302*a*-302*b* connected to the wire 15. The switches 302*a-b* are in turn connected to a processor, which is not shown in the figure. The processor generates the test pattern used to configure the internal registers 240*a-c*.

The wire 15 is connected to the logic pin 20. The wire 15 is in turn connected to an impedance 303 and to a switch 302 in the test computer. The logic pin 20 is connected to an impedance 325 between switch 345 controlled by scanout 340 and switch 302 in test computer. The impedance 303 and 325 form commonly a voltage divider.

The wire 15 and the pin 20 are also connected to complementary inputs of comparators 320a & 320b. The other complementary inputs of comparators 320a & 320b are connected to the voltage divider 315 formed by the resistors 315a, 315b, 315c, from terminals at mid-device 315b. The rails of voltage divider 315, plus at 315a, minus at 315c can in turn be modulated by scan_out 340 to raise and lower comparator threshold levels depending on current scan_out level.

The outputs of the differential amplifiers 320a und 320b are connected to Schmidt-triggers 325a or 325b as well as to a NAND gate 330. The outputs from the Schmidt-triggers 335a und 335b are connected to the output 370 through delay deglitch 350a or delay deglitch 350c, thus providing the high level or the low level to the output 370. The output of the NAND gate 330 provides the mid level output through delay deglitch 350b.

FIG. 4 shows typical transitions of the interface circuit 30 with the mid level multiplied by the observed scan_out signal. The scan_in signal, the scan_enable signal and the scan_clock signal are extracted from the applied transition of the three output levels from the output 370, as can be seen from the FIG. 4, and will be explained in connection with table 3. It will be noted form FIG. 4 that the high, mid and low level values are detected when the signal are within certain level bands determined by comparator threshold levels indicated by horizontal lines in the FIG. 4.

Figure 5:
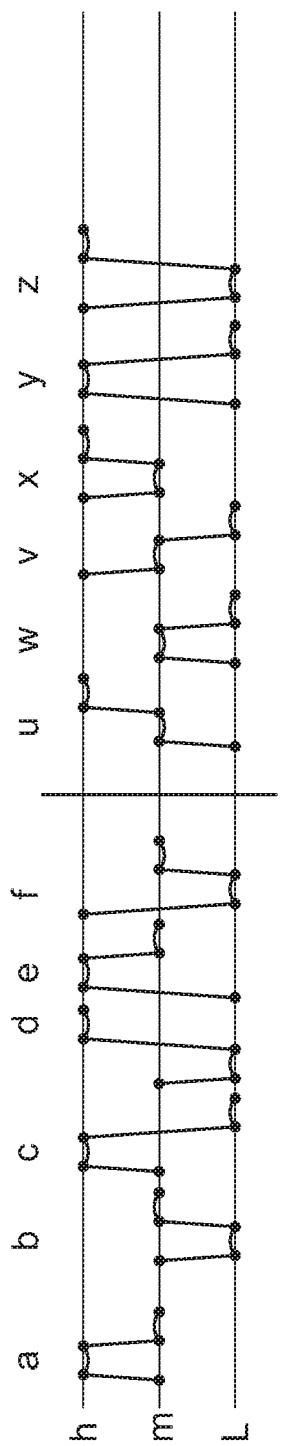
FIG. 5 shows timing diagrams for possible transitions.

Table 3 shows an enumeration of the possible three level transitions over a sequence of three that can infer a cycle. In this table 0 indicates a low level, 1 indicates a mid level and 2 indicates a high level, but this is merely convention. A struck through sequence indicates that this does not lead to a level change and thus is not part of a cycle. It will be seen that there are twelve possible transitions. The timing diagrams of the twelve possible transitions are shown in FIG. 5.

TABLE 3

| Transitions | Shown on timing diagram as the following letter |
|---|---|
| 000 | |
| 001 | |
| 002 | |
| 010 | w |
| 011 | |
| 012 | u |
| 020 | y |
| 021 | e |
| 022 | |
| 100 | |
| 101 | b |
| 102 | d |
| 110 | |
| 111 | |
| 112 | |
| 120 | c |
| 121 | a |
| 122 | |
| 200 | |
| 201 | f |
| 202 | z |
| 210 | v |
| 211 | |
| 212 | x |
| 220 | |
| 221 | |
| 222 | |

Table 4 shows the possible three level transitions over a sequence of two that can generate a clock edge. It will be seen that there are six possibilities.

TABLE 4

| Transition | Sequence generating clock edge |
|---|---|
| 00 | |
| 01 | l2m |
| 02 | l2l |
| 10 | m2l |
| 11 | |
| 12 | m2h |
| 20 | h2l |
| 21 | h2m |
| 22 | |

In this table h=high level, m=mid level and l=low level; h2l means, for example, high level to low level. The struck-through transitions cannot generate a clock edge. Which leads to the following result in table 5:

TABLE 5

| Transition | Scan Clock Edge | Scan Clock | Scan In | Scan_shift_enable |
|---|---|---|---|---|
| m2h | ↑ | ⇒1 | 1 | |
| m2l | ↑ | ⇒1 | 0 | |
| h2m | ↓ | ⇒0 | | 1 |
| l2m | ↓ | ⇒0 | | 1 |
| h2l | ▨ | 1 | 1 | |
| l2h | ▨ | 1 | 0 | |
| h2l | ▨ | 0 | | 0 |
| l2l | ▨ | 0 | | 0 |

Figure 6A:
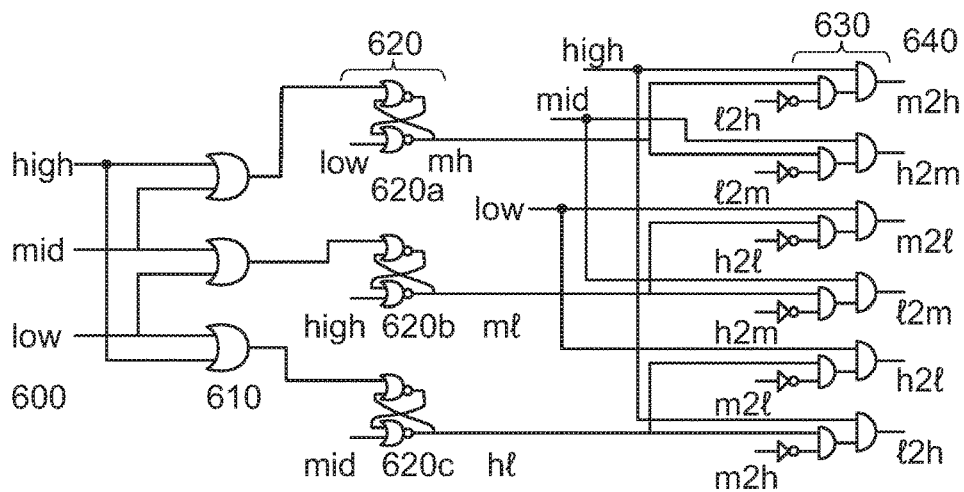
FIGS. 6A to 6C show an exemplary implementation of the decoder.
Figure 6B:
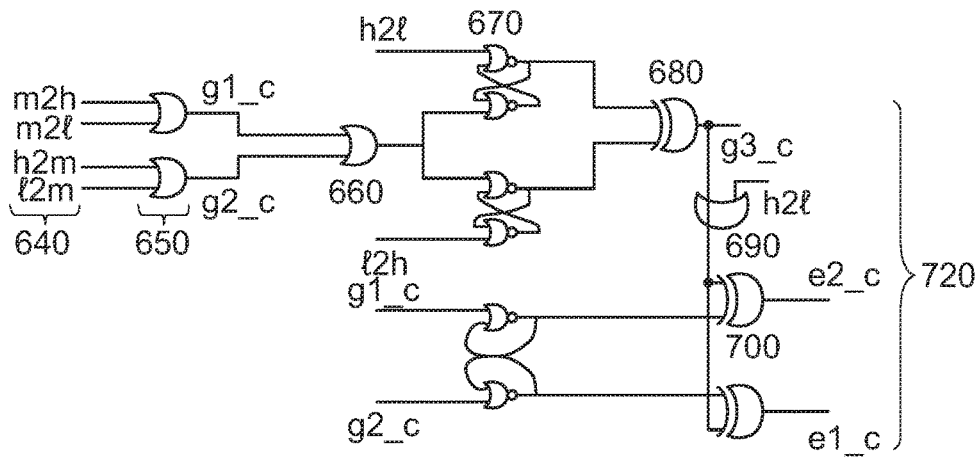
Figure 6C:
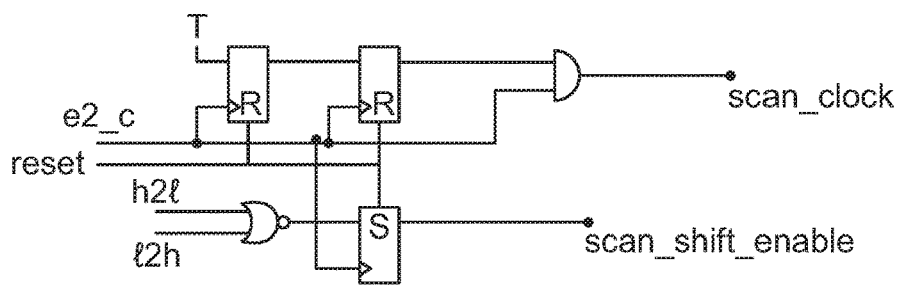
Figure 6C:
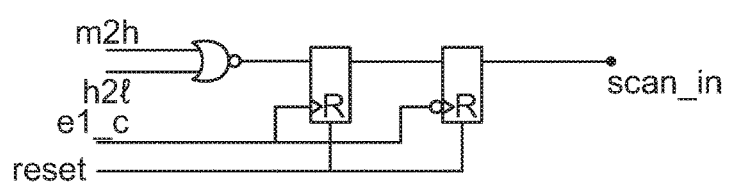

FIGS. 6A to 6C show an exemplary implementation of the decoder 34 to extract scan_clock signal, the scan_shift_enable signal and the scan_in signal from the low level, mid level and high level values, which are generated by the circuit shown in FIG. 3. This implementation generates synchronous and glitch-free signals to generate the scan_in, the scan_clock and the scan_shift_enable signals. The skilled person will appreciate that this is only one gate level implementation and this will be understood to be merely exemplary.

It will be seen from FIG. 6A that there are three inputs 600 from the level detection circuit 32 shown as the high level input, the mid level input and the low level input, which are forwarded to OR gates 610. The output of the OR gates 610 are forwarded to a plurality of NOR gates 620, which are arranged to check sequence of pairs of levels. The output of the uppermost NOR gate 620a indicates when the transition goes from mid to high or high to low. The output of the midmost NOR gate 620b indicates a transition from mid level to low level or low level to mid level and the output of the lowermost NOR gate 620c indicates a transition from the high level to the low level or low level to high level. The outputs of the NOR gates 620a-c are passed to further AND gates 630 where the outputs are further compared to inputs and indicates the transitions mid level to high level (m2h), high level to mid level (h2m), mid level to low level (m2l), low level to mid level (l2m), high level to low level (h2l) and low level to high level (l2h) as shown in the outputs 640.

The outputs 640 can then be input into the circuit shown on FIG. 6B, which comprises OR gates 650 passing their output to a further OR gate 660. It will be seen, that the OR Gate 660 is connected to further NOR Gates 670, which have connections to further ones of the output signal 640. In this exemplary case to the high level to low level h2l signal and the low level to high level l2h signal, which is then passed through to a XOR Gate 680 to produce an output signal indicated as g3-c. The output of the g3-c signal is then passed to a further to an OR gate 690, where it is compared with the high level to low level h2l signal and passed to a further to XOR gates 700 and 710. Another input of the XOR gates 700 is connected to outputs from the AND gates 650 as shown in FIG. 6B to produce output signals e2-c and e1-c.

The outputs 720 from FIG. 6B are passed to the circuit shown in FIG. 6C to produce the signals scan_clock signal, scan_shift_enable and the scan_in signals. This circuit shown in FIG. 6C is designed to align the phase of the scan_in signal and the scan_shift_enable signal to the scan_clock signal using a plurality of registers. The scan_clock signal has a pipeline reset using the registers to establish an initial high phase to avoid an initial false edge on startup. The scan_clock signal is pipelined as e2_c output from 720 in FIG. 6B. The scan_shift_enable signal is pipelined the h2l or l2h transition from FIG. 6B sampled at e2_c. The scan_in signal is pipelined m2h or l2h from FIG. 6B sampled at e1_c and phase shifted to opposite edge of e1_c.

Figure 7:
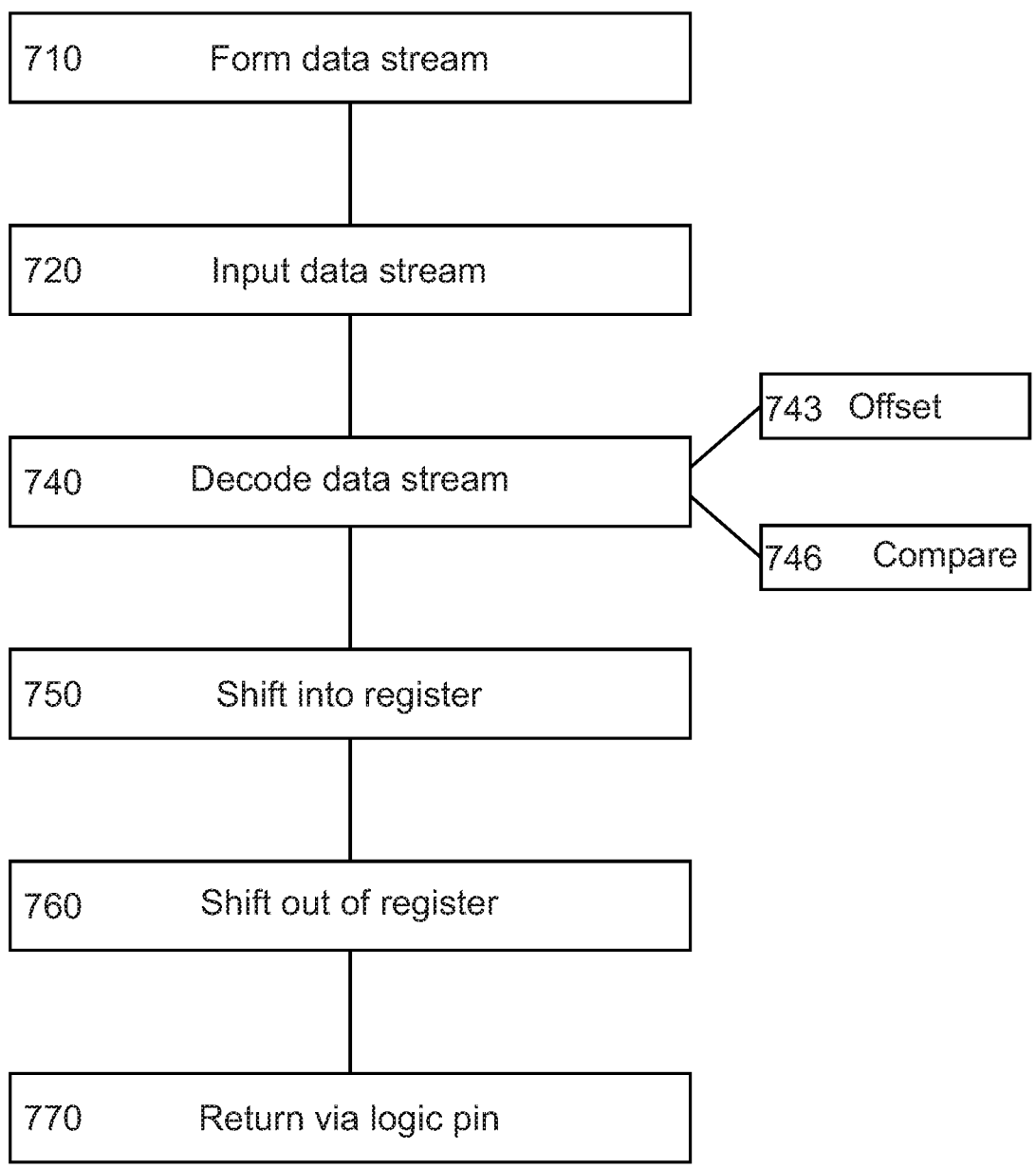
FIG. 7 shows the method.

An outline of the method for testing the electronic device 100 is shown in FIG. 7. It will be appreciated that the steps shown in this method are happening concurrently as the bits of information are shifted into and out of the digital circuit 50 under test. In a first step 710 the input data stream is formed using the data stream generator 300 shown in FIG. 3. The input data stream is passed along the wire 315 in step 710 to the logic pin 20 and the level detection circuit 32 in the interface circuit 30. The decoder 34 is able to decode the input data stream in step 740 by comparing in step 736 the values on the input data stream with the comparator threshold values, as indicated on FIG. 4. These values can be offset in step 743 with the values on the output data stream from the output 42.

The decoded values from the decoder 34 are shifted into the shift register 40 through the input 41 in step 750 on detection of a scan_shift_enable signal and then after testing and on detection of a scan_out signal shifted out of the shift register 40 through the output 42 in step 760. The outputted values are returned in step 770 through the single logic pin 20.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

REFERENCE NUMERALS

10 Electronic Device
15 Wire
20 Logic Pin
30 Interface Circuit
32 Level detection circuit
34 Decoder
40 Shift scan register
45 Connections
50 Circuit
200 Device core
210 Scan_in line
220 Scan_out line
230 Scan_shift enable line
240a-c Registers
250 Configure
260 Capture
300 Data stream generator
303 Impedance
305 Supply
310 Earth
315a-c Resistance
320a-b Differential amplifier
325 Output impedance
330 NAND Gate
335a,b Schmidt-Triggers
340 Scan out line
345 Switch
350a-c Output gate
370 Output lines
600 Inputs
610 OR gates
620 NOR gates
630 AND gates
640 Outputs
650 OR gates
660 OR gate
670 NOR gates
680 XOR gate
690 OR gate
700 XOR gate
710 XOR gate
720 Output

What is claimed is:

1. A method for testing an electronic device, said method comprising:
    forming an input data stream having three level bands;
    inputting the input data stream through a logic pin; and
    decoding the input data stream to identify a scan_in signal, a scan_shift_enable signal and a scan_clock signal; and returning contemporaneously a scan_out signal as an output through the same logic pin.

2. The method of claim 1, wherein the three level bands are one of three voltage bands or three current bands.

3. The method of claim 1, wherein one of the three level bands is weakly driven and the other two of the three level bands are strongly driven.

4. The method of claim 1, wherein the decoding of the data stream comprises comparing data values in the input data stream with comparator threshold levels for detecting actual level within the three level bands.

5. The method of claim 4, wherein the data values in the data steam are on input offset by returned scan_out levels on the output.

6. The method of claim 1, wherein a transition between one of the three level bands to another one of the three level bands defines a clock cycle edge.

7. The method of claim 1, wherein the input data stream further comprises a plurality of test values.

8. The method of claim 7, wherein the test values are shifted and captured into a scan shift register after detection of a scan_shift_enable signal.

9. An interface circuit for applying a data stream for a testing an electronic device through a single logic input pin connected to the electronic device comprising:

a level detection circuit connected to the single logic input pin, the level detection circuit being configured to detect one of three level bands in the data stream;

a decoder connected to the level detection circuit for generating a group of signals comprising a scan_in signal, a scan_shift_enable signal and a scan_clock signal, applying the generated group of signals to a shift scan register, and adapted to shift contemporaneously out the values captured in the scan shift register back out the same logic pin.

10. The interface circuit of claim 9, being configured to generate a clock signal from the data stream.

11. An electronic device comprising a shift scan register and an interface circuit for applying a data stream for a testing an electronic device through a single logic input pin connected to the electronic device comprising:

a level detection circuit connected to the single logic input pin, the level detection circuit being configured to detect one of three level bands in the data stream;

a decoder connected to the level detection circuit for generating a group of signals comprising a scan_in signal, a scan_shift_enable signal and a scan_clock signal, applying the generated group of signals to a shift scan register, and adapted to shift contemporaneously out the values captured in the scan shift register back out the same logic pin.

12. An electronic device comprising a shift scan register and an interface circuit for applying a data stream for a testing an electronic device through a single logic input pin connected to the electronic device comprising:

a level detection circuit connected to the single logic input pin, the level detection circuit being configured to detect one of three level bands in the data stream;

a decoder connected to the level detection circuit for generating a group of signals comprising a scan_in signal, a scan_shift_enable signal and a scan_clock signal, applying the generated group of signals to a shift scan register, and adapted to shift contemporaneously out the values captured in the scan shift register back out the same logic pin, wherein the interface circuit being configured to generate a clock signal from the data stream.

* * * * *